United States Patent
Survakumar

(10) Patent No.: US 6,936,498 B2
(45) Date of Patent: Aug. 30, 2005

(54) PACKAGE STRUCTURE WITH INCREASED CAPACITANCE AND METHOD

(75) Inventor: Mahadevan Survakumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/857,391

(22) Filed: May 28, 2004

(65) Prior Publication Data

US 2004/0217469 A1 Nov. 4, 2004

Related U.S. Application Data

(62) Division of application No. 10/401,379, filed on Mar. 27, 2003, now Pat. No. 6,787,902.

(51) Int. Cl.[7] .......................... H01L 21/44; H01L 21/20
(52) U.S. Cl. ...................... 438/106; 438/379; 438/381; 438/396
(58) Field of Search ................................ 438/379, 106, 438/107, 396, 381

(56) References Cited

U.S. PATENT DOCUMENTS

| 5,177,670 A | * | 1/1993 | Shinohara et al. ........... 361/738 |
| 5,625,221 A | | 4/1997 | Kim et al. ................... 257/686 |
| 2003/0096447 A1 | * | 5/2003 | Lao et al. .................... 438/106 |
| 2003/0173673 A1 | * | 9/2003 | Val ............................ 257/758 |
| 2003/0222314 A1 | * | 12/2003 | Nair ............................ 257/368 |
| 2004/0002187 A1 | * | 1/2004 | Block et al. ................. 438/238 |

* cited by examiner

Primary Examiner—Jasmine Clark
(74) Attorney, Agent, or Firm—Schwegman, Lundberg, Woessner & Kluth, P.A.

(57) ABSTRACT

A package with increased capacitance comprises a core and a plurality of buildup layers. The core has an inner dielectric portion and the core outer conductive layer. The buildup layers are disposed over the core and have offset ablated regions reducing the thickness of the buildup layers in the ablated regions. Conductive material is plated on the buildup layers including within the ablated regions. The reduced thickness and increased plate area due to the ablated regions increases the capacitance between adjacent buildup layers. Processors and processing systems may take advantage of the increased capacitance in the package to draw more current and operate at higher data rates.

3 Claims, 6 Drawing Sheets

PACKAGE STRUCTURE WITH INCREASED CAPACITANCE AND METHOD

This application is a divisional of U.S. patent application Ser. No. 10/401,379, filed on Mar. 27, 2003 now U.S. Pat. No. 6,787,902, which is incorporated herein by reference.

TECHNICAL FIELD

The present invention pertains to packages for semiconductor substrates, and in some embodiments, to package structures suitable for higher frequency processors and processing systems.

BACKGROUND

Semiconductor substrates, and in particular, substrates that include processors and processing systems, continue to operate at increasing faster data rates leading to higher current consumption levels. In some cases, the frequency of operation may be set by the lower limit of the voltage in the voltage tolerance window. The smaller the voltage tolerance window around the nominal operating voltage, the higher the supply voltage must be to achieve a higher operating frequency and hence, higher data rates. One goal of package design is to help reduce the voltage tolerance window around the nominal operating voltage. Adding capacitance between ground (Vss) and supply (Vcc) power planes in a package helps reduce the voltage tolerance window allowing, in the case of processor and processing systems, higher operating frequencies.

Convention approaches to providing capacitance between the power planes utilize a parallel plate structure formed by the power planes with dielectric between the plates. Design criteria for a particular technology limits the maximum capacitance available in these conventional approaches. This capacitance is often insufficient for operating high frequency processors and processing systems.

Thus there is a general need for a package structure with increased capacitance. There is also a need for a package structure suitable for use with high frequency processors and processor systems. There is also a need for a package structure with increased capacitance that falls within design criteria for a particular technology.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the full ambit of the claims and all available equivalents.

Embodiments of the present invention provide, among other things a package with increased capacitance. The package includes a core and a plurality of buildup layers. The core may have an inner dielectric portion and outer conductive layers. In embodiments, the buildup layers are disposed over the core and may have offset ablated regions reducing the thickness of the buildup layers in the ablated regions. Conductive material may be plated on the buildup layers including within the ablated regions. The reduced thickness and increase plate area due to the ablated regions may increase the capacitance between adjacent buildup layers. Processors and processing systems, for example, may take advantage of the increased capacitance in the package to draw more current and operate at higher data rates.

Figure 1:
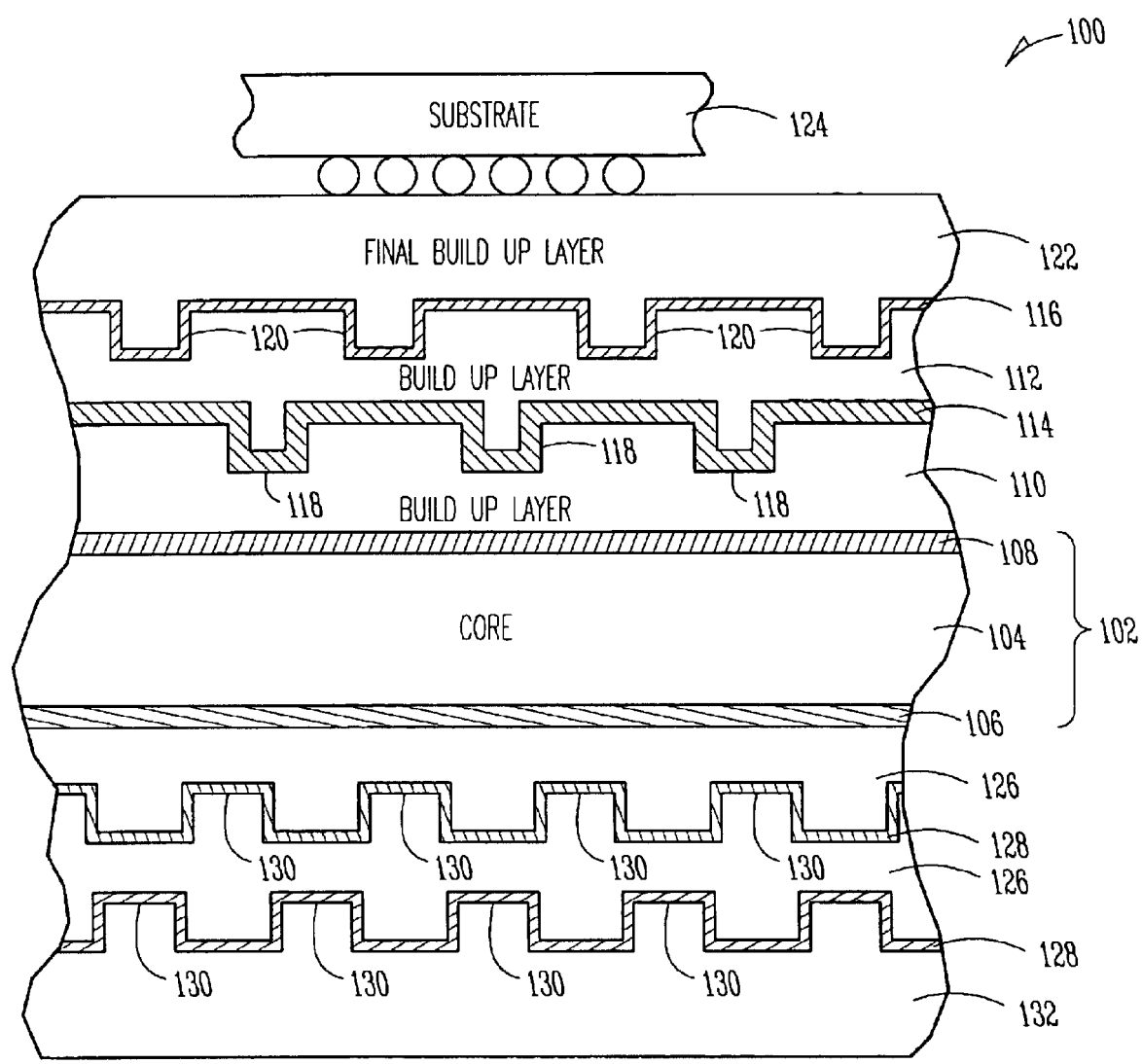
FIG. 1 is a cross-sectional view of a package structure in accordance with embodiments of the present invention.

FIG. 1 is a cross-sectional view of a package structure in accordance with embodiments of the present invention. Package structure 100 may be used as a package for semiconductor substrates and may be used to couple semiconductor substrates with a circuit board. In some embodiments, structure 100 may be used to couple a processor or processing system with a motherboard.

Package structure 100 includes core 102 which may be comprised of dielectric material 104 and conductive layers 106 and 108. Core 102 may be a commercially available core which may use FR4, FR5 or organic materials such as Bismaleimide Triazine (BT) as dielectric material 104 and a copper foil as conductive layers 106 and 108, although other types of cores may also be suitable. Package structure 100 also may also include one or more buildup layers, such as buildup layers 110 and 112. The buildup layers may have conductive material 114 and 116 disposed thereon. In accordance with embodiments of the present invention, at least some of the buildup layers have ablated regions 118 which reduce the thickness of the buildup layers at the ablated regions. In the case of buildup layer 110, conductive layer 108 and conductive material 114 may operate as plates of a parallel-plate capacitor with capacitance provided between the core conductive layer 108 and conductive material 114. Because the conductive material 114 may be disposed within ablated regions 118, an increase in capacitance results due to the reduced distance between conductive material 114 and conductive layer 108 in ablated regions 118. Furthermore, the surface area of the capacitor's plate served by conductive material 114 is increased due to the plating in ablated regions 114 further increasing the capacitance. Accordingly, package structure 100 provides a capacitor between conductive material 114 and conductive layer 108 with increased capacitance.

In embodiments, package structure 100 may include buildup layer 112 having ablated regions 120 with conductive material 116 therein. This may similarly provide increased capacitance between conductive material 116 and conductive material 114. In embodiments, ablated regions 120 may be offset from ablated regions 118. Only a small portion of package structure 100 is illustrated, and in some embodiments, package structure 100 may have many buildup layers with ablations and conductive material therebetween to provide increased capacitance between the layers. Package structure 100 may include final buildup layer 122 without ablations upon which substrate 124 may be surface mounted. In embodiments, conductive layer 108 and conductive materials 114 and 116 may be power planes used to provide current to substrate 124. In these embodiments, the conductive layers/materials may alternate between Vcc and Vss or ground potentials to provide capacitance on input power paths.

In embodiments, ablated regions 118 and 120 may be trenches which extend into the page of FIG. 1. In alternative embodiments, ablated regions 118 and 120 may be generally circular (e.g., like islands when viewed from above or below). In these embodiments, the capacitance between the layers may be increased by factors of two or more in the case of circular ablated regions, and by up to factors of 2.7 or more in the case of trench-like ablated regions. The capacitance between the layers may be further increased through the use of higher dielectric materials for the buildup layers. Examples of higher dielectric material include ferroelectric materials.

Ablated regions 118 and 120 may be formed by a laser-ablating process which may also be used to form vias or micro-vias through buildup layers of package structure 100. The vias or micro-vias may be used to couple conductive paths between the layers. The ablated regions may be viewed as half-micro-vias because they extend only part way through a buildup layer while micro-vias may extend completely through the buildup layer. The distance between the ablated regions may be determined based on the location within the package and process and structure considerations. In embodiments, the distance between ablated regions may be as little as 25 to 50 microns.

Buildup layers, such as buildup layers 110 and 112, may be comprised of almost any dielectric material. In some embodiments, the buildup layers may be comprised of an organic material such as Ajinimoto Buildup Film (ABF), while in other embodiments, the buildup layers may be a ceramic material or a ferroelectric material such as Barium Titanate. In addition to FR4 or Bismaleimide Triazine, other materials suitable for core dielectric 104 may include Megtron and a copper alloy such as Alloy 50, Alloy 42 or Alloy 36.

Conductive material used for conductive materials 114 and 116 may be almost any conductive material that may be disposed over a buildup layer. In some embodiments, the conductive materials may include an electroless plated and/or electrolytic plated material such as copper, although other materials such as aluminum or silver may also be used.

In some embodiments, package structure 100 may include additional buildup layers 126 with associated conductive materials 128 disposed on an opposite side of core 102. In these embodiments, additional buildup layers 126 may also include ablated regions 130 with conductive material 128 therein to provide additional capacitance between the layers. Additional final buildup layer 132 may also be included and used to mount to a circuit board (not illustrated) such as a motherboard. In embodiments, package structure 100 may have a length in an x-dimension and width in a y-dimension on the order of thirty-five millimeters, and each buildup layer may be on the order of 30 microns in a z-dimension.

Figure 2:
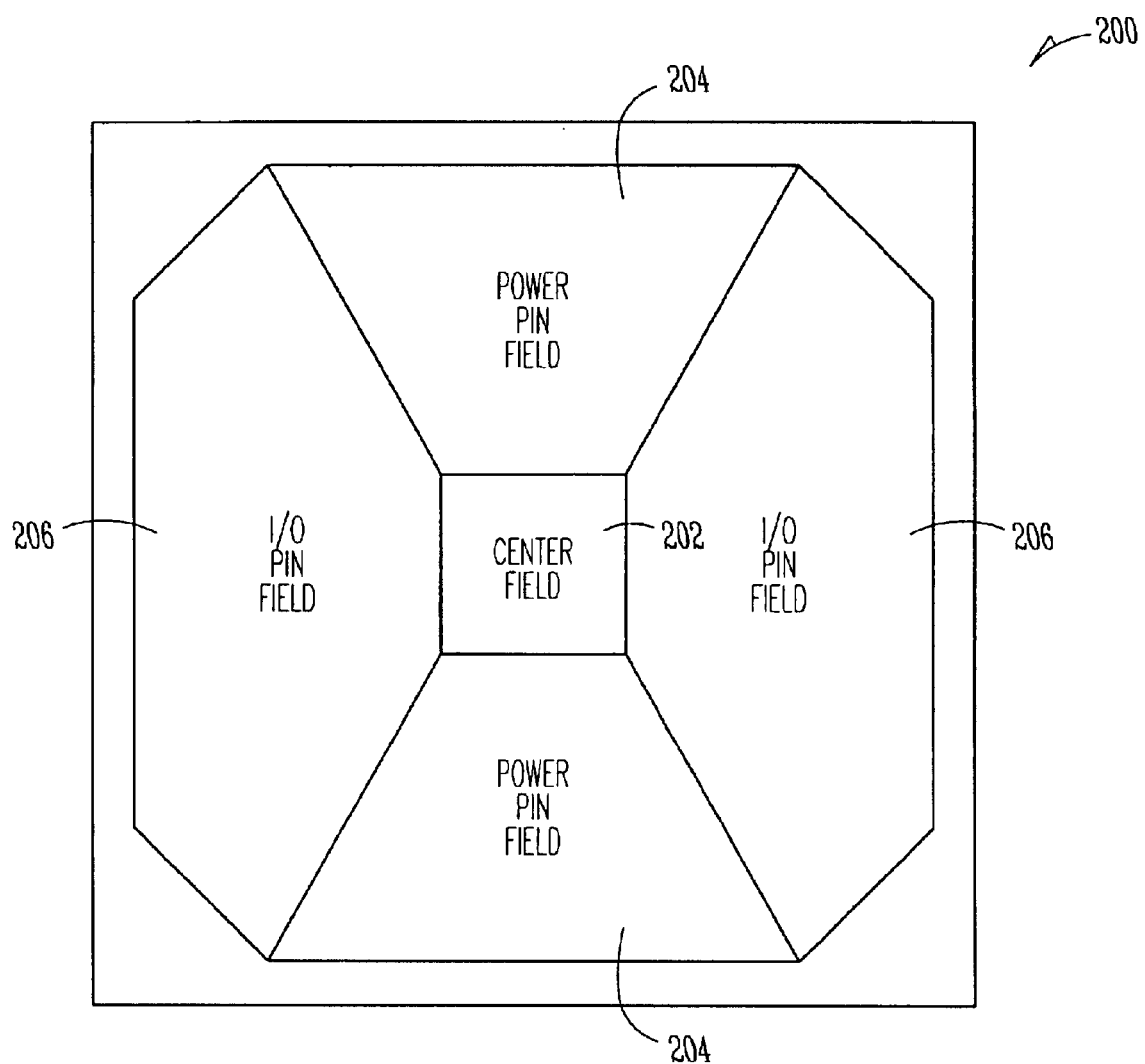
FIG. 2 is a top view of a package structure in accordance with embodiments of the present invention.

FIG. 2 is a top view of a package structure in accordance with embodiments of the present invention. Package structure 200 may be a top or bottom view of a package structure that includes portions of package structure 100 (FIG. 1). Package structure 200 may include center field 202 which may be an area in which a substrate, such as substrate 124, may be surface mounted. Package structure 200 may also include power-pin fields 204 and input/output (I/O) pin fields 206. Power-pin fields 204 may be regions in which power pins from a substrate are coupled to a circuit board, while I/O pin fields may be regions in which I/O pins from a substrate are coupled to a circuit board. Additional capacitance is desirable for the power pins to provide additional current as well as filtering. Additional capacitance is generally not desirable for I/O pins which may carry data at high data rates.

In accordance with embodiments, the first layer below the substrate, referred to as layer 1, may be comprised of a buildup layer, such as buildup layer 112 (FIG. 1) with conductive material, such as conductive material 116 (FIG. 1), thereon. Conductive material in power pin fields 208 of layer 1 may provide a power plane, such as for Vcc, and may have ablated regions, such as ablated regions 120 (FIG. 1). The conductive material in I/O fields 208 may comprise signal paths for the various I/O pins and accordingly and will generally not have ablated regions. A second layer below layer 1, referred to as layer 2, may serve as a ground or power plane and may be comprised of buildup layer, such as buildup layer 110 (FIG. 1) with conductive material 114 (FIG. 1) serving as the ground or power plane. For layer 2, ablated regions may be provided in power pin fields 204 increasing the capacitance of the power plane, at least in those areas. Similar to layer 1, I/O fields 208 may generally not have ablated regions because increased capacitance is less desirable for the I/O pins.

When package structure 200 includes additional layers, referred to as layers 3 and up, these additional layers may have ablated regions in both the power pin fields 204 and the I/O pin fields when the additional layers provide power and ground planes. In these embodiments, the conductive material may alternate between Vcc and Vss (e.g., ground) to provide increased capacitance between the power planes. Packages for processors and processing elements may have packages with layer counts of up to six or more.

Figure 3:
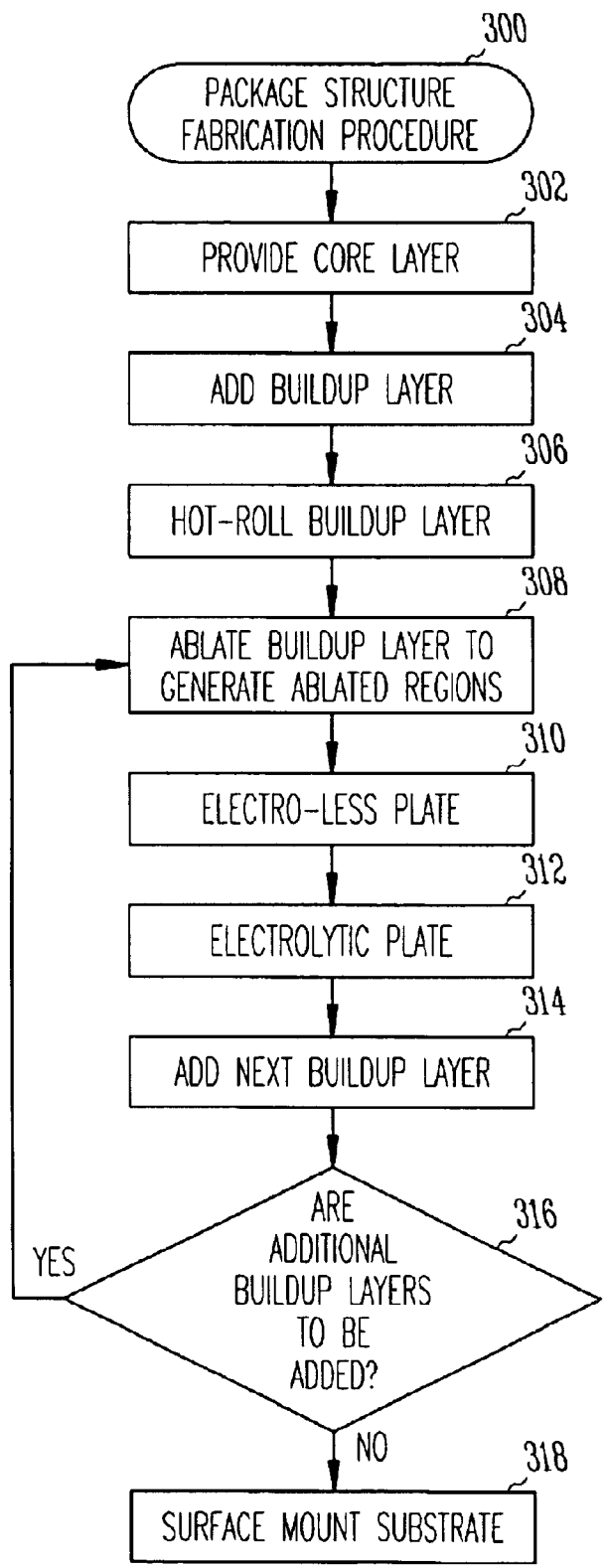
FIG. 3 is a flow chart of package structure fabrication procedure in accordance with an embodiment of the present invention.

FIG. 3 is a flow chart of package structure fabrication procedure in accordance with an embodiment of the present invention. Procedure 300 may be used to fabricate a package structure with improved capacitance, such as structure 100 (FIG. 1), although other structures may also fabricated with procedure 300.

In operation 302, a core, such as core 102 (FIG. 1) is provided. The core may have an inner dielectric portion and one or more outer conductive layers.

In operation 304, a buildup layer, such as buildup layer 110 (FIG. 1), is added to the core. The buildup layer may be comprised of a dielectric material and may be deposited or placed over the core. In operation 306, the buildup layer may be hot-rolled to flatten and/or compress the buildup layer and help the buildup layer adhere to the core.

In operation 308, the buildup layer is ablated to generate ablated regions in the buildup layer, such as ablated regions 118 (FIG. 1). Operation 308 may use a laser-ablating process to form the ablated regions although other processes, which may use light-sensitive chemical etchants to ablate small regions in a buildup layer film dielectric material may also be used. The ablated regions may be in the form of trenches in the buildup layer, or alternatively, may be more like circular recesses or potholes in the buildup layer (e.g., like half micro vias).

In operation 310, a conductive material, such as conductive material 114 (FIG. 1), may be disposed over the buildup layer. The conductive material may be disposed in the ablated regions as well as non-ablated regions of the buildup layer. Operation 310 may be an electro-less plating operation which generates a thin conductive layer (e.g., a seed layer) of the conductive material. Operation 312 may use an electrolytic plating process to deposit additional conductive material to generate a thicker layer of conductive material, such as conductive material 114 (FIG. 1).

In operation 314, another buildup layer, such as buildup layer 112 (FIG. 1), may be added to the prior buildup layer. The added buildup layer may also be hot-rolled to flatten the dielectric material across the surface of the package as done in operation 306. Operation 316 determines if additional buildup layers are to be added to the package structure. When additional buildup layers are to be added, operations 308 through 314 may be repeated for each addition buildup layer. When no additional buildup layers are to be added, the last buildup layer added may correspond with buildup layer 122 (FIG. 1). Operation 318 may be performed in which a substrate, such as substrate 124 (FIG. 1), is surface mounted on the package structure.

In some embodiments of the present invention, operations 304 through 316 may be performed for adding additional buildup layers, such as buildup layers 126 (FIG. 1). The additional buildup layers may be with or without ablated regions and may be on the opposite side of the core 102 (FIG. 1).

Although the individual operations of procedure 300 are illustrated and described as separate operations, one or more of the individual operations may be performed concurrently and nothing requires that the operations be performed in the order illustrated.

Figure 4A:
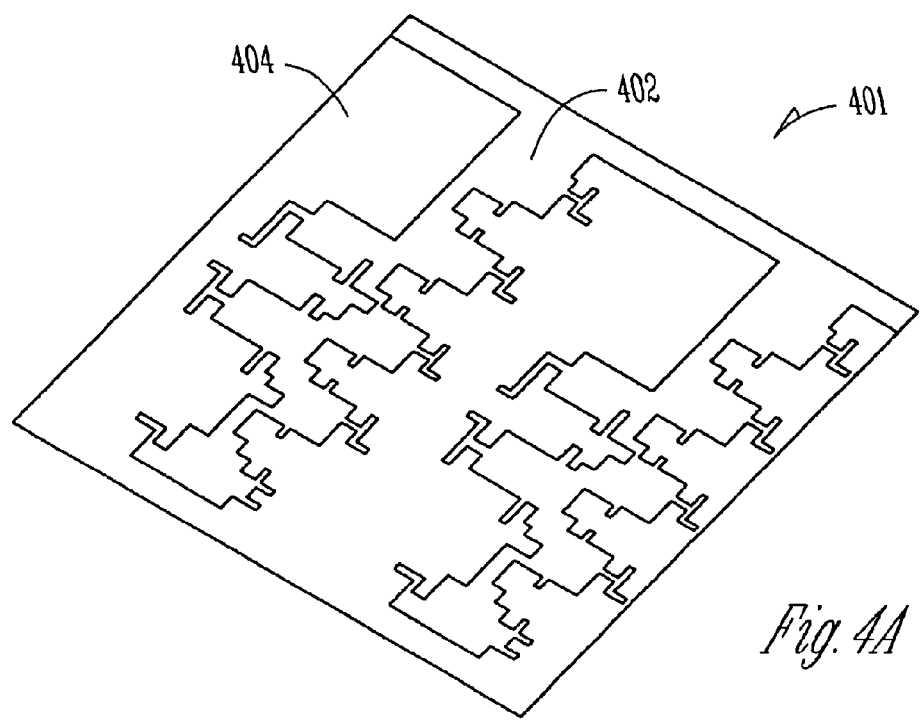
FIGS. 4A and 4B are perspective views of power and ground planes in accordance with another embodiment of the present invention.
Figure 4B:
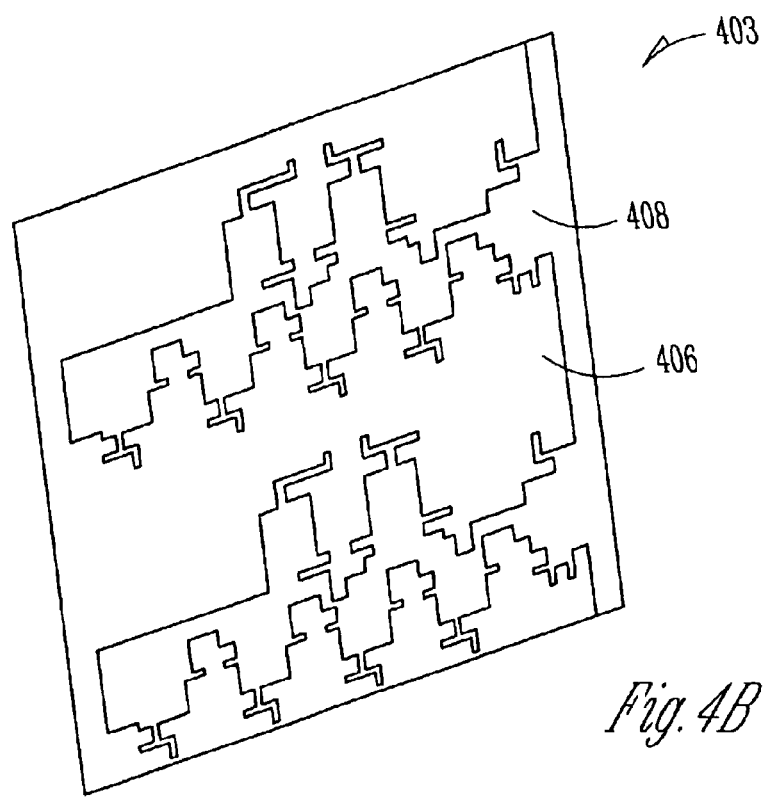

FIGS. 4A and 4B are perspective views of power and ground planes in accordance with other embodiments of the present invention. FIG. 4A may illustrate back side layer 401 of power plane 402 and ground plane 404, while FIG. 4B may represent the front side layer 403 of power plane 406 and ground plane 408. In these embodiments, capacitance between the power and ground planes of a package structure is increased not only through the use of ablated regions discussed above, but through the use of capacitance generated within a layer. In this embodiment, as shown in FIG. 4A, power plane 402 and ground plane 404 may be provided by conductive material of the same layer 401. For example, a portion of conductive material 114 (FIG. 1) may provide ground plane 404 while another portion of conductive material 114 (FIG. 1) may provide power plane 402. The portions may have a separation therebetween so that they are electrically isolated.

Figure 5:
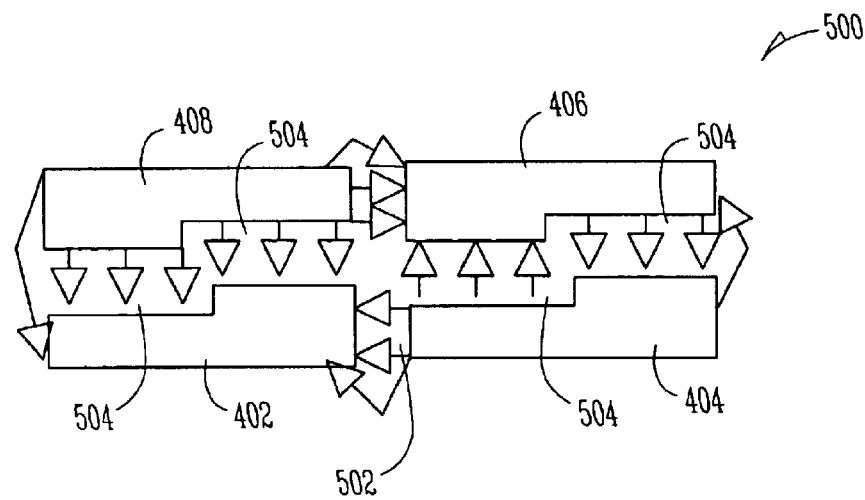
FIG. 5 is a cross-sectional view of a portion of the power and ground planes of FIG. 4.

FIG. 5 is a cross-sectional view of a portion of the power and ground planes of FIGS. 4A and 4B. In cross section 500, separations 502 between power plane 402 (FIG. 4A) and ground plane 404 (FIG. 4A) illustrate some of the additional capacitance provided between the ground plane 404 (FIG. 4A) and power plane 402 (FIG. 4A). Referring back to FIGS. 4A and 4B, in layer 403, power plane 406 and ground plane 408 are fabricated in positions opposite of ground plane 404 and power plane 402, respectively of layer 401 so that capacitance is provided between the layers as illustrated in FIG. 5. Ground plane 408 and power plane 406 also have separations therebetween so that they are electrically isolated and that additional capacitance may result from this separation. Cross section 500 also illustrates ablated regions 504 which have reduced the thickness of the buildup layers providing an increased capacitance between the power and ground planes. In embodiments, this configuration may increase the electric flux density not just in the X-Y dimension, but also in the X-Y-Z dimension resulting in a further increase in capacitance. As packaging technology advances allowing the spacing between metal structures to be reduced more than the z-dimension, higher capacitance per unit volume may be achieved.

In embodiments, power planes 402 and 406, and ground planes 404 and 408 may be generated in a pattern to help maximize this additional capacitance. Conductive regions of layers 401 and 403 illustrate an example pattern. Increasing the overlap area between the power and ground plane structures by creating bends and small projections may increase the lateral electric flux density resulting in higher capacitance. In embodiments, using the fractal geometry along with ablating small regions of the dielectric, the total increase in capacitance may be up to a fourteen times or more over that of conventional parallel plate capacitors.

Figure 6:
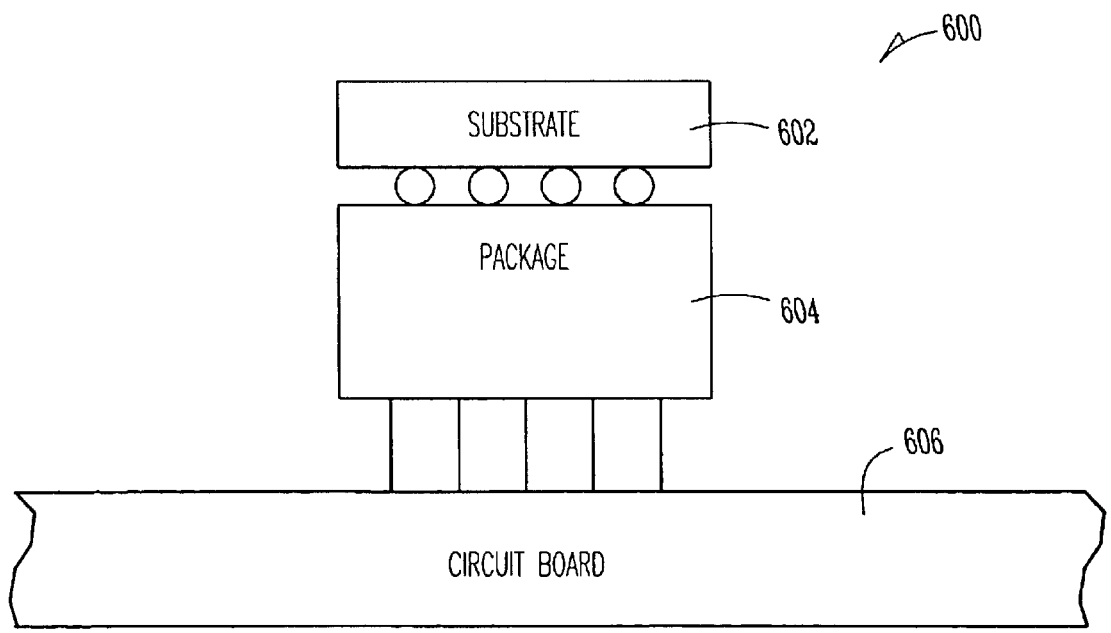
FIG. 6 is a system in accordance with embodiments of the present invention.

FIG. 6 is a system in accordance with embodiments of the present invention. System 600 includes substrate 602 which may include a processor or processing system. Substrate 602 may be surface mounted to package structure 604 through any of many surface mounting techniques. Package structure 604 may be mounted to circuit board 606. Package structure 604 may be a package or package structure that provides increased capacitance, such as package structure 100 (FIG. 1) although other packages may also be suitable. The package structure, for example, may include a core and a plurality of buildup layers. In embodiments, the buildup layers may be disposed over the core and may have offset ablated regions reducing the thickness of the buildup layers in the ablated regions. Conductive material may be disposed on the buildup layers including within the ablated regions. The reduced thickness and increased plate area due to the ablated regions may increase the capacitance between the adjacent buildup layers. Processors and processing systems, which may be part of substrate 602, may take advantage of this increased capacitance in the package structure to draw more current to operate at higher data rates. In some embodiments, additional increased capacitance in package structure 604 may be provided by a z-dimension capacitance illustrated in FIG. 5.

Figure 7A:
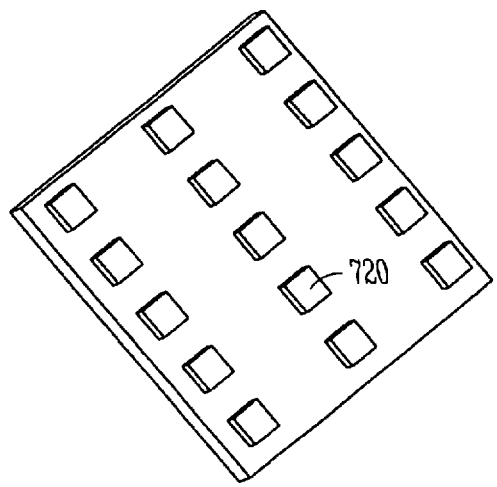
FIGS. 7A and 7B illustrate ablated regions in power and ground planes in accordance with an embodiment of the present invention.
Figure 7B:
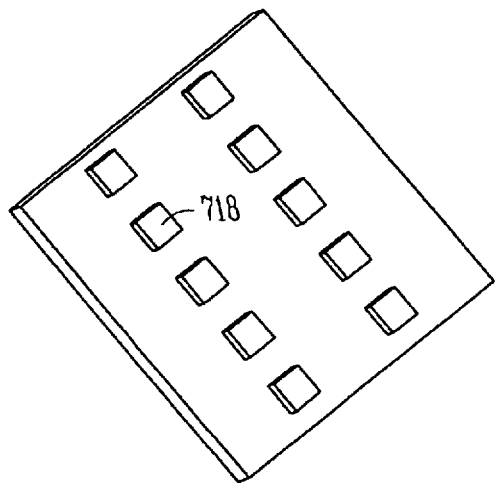
Figure 8A:
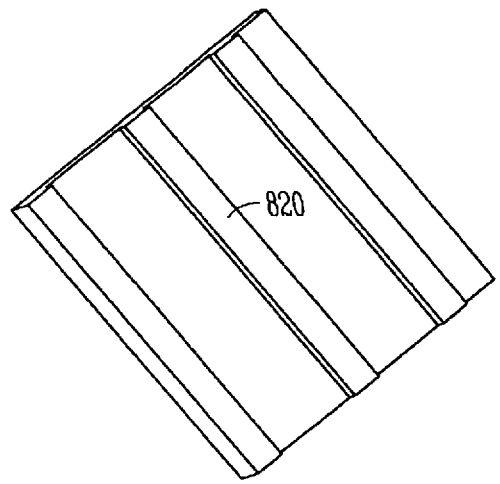
FIGS. 8A and 8B illustrate ablated regions in power and ground planes in accordance with another embodiment of the present invention.
Figure 8B:
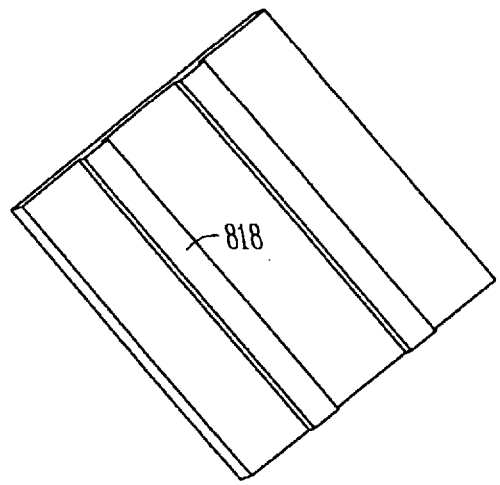

FIGS. 7A and 7B illustrate ablated regions in power and ground planes in accordance with an embodiment of the present invention. FIGS. 8A and 8B illustrate ablated regions in power and ground planes in accordance with another embodiment of the present invention. FIGS. 7A and 7B illustrate ablated regions 720 and 718 in the form of "islands", and FIGS. 8A and 8B illustrate ablated regions 820 and 808 in the form of "trenches". Both the "island" embodiment illustrated in FIGS. 7A and 7B and the "trench" embodiment illustrated in FIGS. 8A and 8B, as well as combinations thereof, are suitable for use with package structure 100 (FIG. 1). Ablated regions 720 and 718 may correspond respectively with ablated regions 120 and 118 (FIG. 1). Ablated regions 820 and 818 may correspond respectively with ablated regions 120 and 118 (FIG. 1). Although the islands illustrated in FIGS. 7A and 7B and the trenches illustrated in FIGS. 8A and 8B are illustrated as well defined and substantially rectangular, those of skill in the art will appreciate that the particular fabrication technique may result in less defined or rougher ablated regions.

Thus, a method and package structure with increased capacitance has been described. A method and package structure suitable for use with high frequency processors and processor systems has also been described. A method and package structure with increased capacitance that falls within design criteria for a particular technology has also been described.

The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, the invention embraces all such alternatives, modifications, equivalents and variations as fall within the spirit and scope of the appended claims.

What is claimed is:

1. A method of fabricating a package structure comprising:

adding a buildup layer disposed over a core outer conductive layer of a core, the buildup layer comprised of a buildup layer dielectric;

ablating the buildup layer to form ablated regions therein to thin the buildup layer in the ablated regions; and plating the ablated buildup layer with a buildup layer conductive material disposing the conductive material over the buildup layer including within the ablated regions of the buildup layer, wherein the core outer conductive layer and the buildup layer conductive material provide capacitance therebetween, the thinner buildup layer in the ablated regions increasing the capacitance.

2. The method of claim 1 wherein the buildup layer is a first buildup layer, the buildup layer conductive material is a first buildup layer conductive material, the ablated regions are first buildup layer ablated regions, and the capacitance is a first capacitance, and wherein the method further comprises:

adding a second buildup layer disposed over the first buildup layer conductive material, the second buildup layer comprised of the buildup layer dielectric; and ablating the second buildup layer to generate second buildup layer ablated regions therein reducing a thickness of the second buildup layer in the second buildup layer ablated regions.

3. The method of claim 2 further comprising:

plating the ablated second buildup layer with second buildup layer conductive material disposed over the second buildup layer including within the second buildup layer ablated regions, wherein the second buildup layer ablated regions are offset from the first buildup layer ablated regions, and wherein the first buildup layer conductive material and the second buildup layer conductive material provide a second capacitance with additional second capacitance being provided by the reduced thickness of the second buildup layer in the second buildup layer ablated regions.

* * * * *